United States Patent [19]
Marui et al.

[11] Patent Number: 5,257,166
[45] Date of Patent: Oct. 26, 1993

[54] CONFIGURABLE ELECTRONIC CIRCUIT BOARD ADAPTER THEREFOR, AND DESIGNING METHOD OF ELECTRONIC CIRCUIT USING THE SAME BOARD

[75] Inventors: Tomohiro Marui, Fuchuu; Yoshihiro Ishida, Chiba; Hiroyuki Oka, Chiba; Izumi Hayashibara, Chiba, all of Japan

[73] Assignee: Kawasaki Steel Corporation, Hyogo, Japan

[21] Appl. No.: 966,904

[22] Filed: Oct. 22, 1992

Related U.S. Application Data

[63] Continuation of Ser. No. 531,061, May 31, 1990, abandoned.

[30] Foreign Application Priority Data

Jun. 5, 1989 [JP] Japan ............... 1-142381
Jun. 5, 1989 [JP] Japan ............... 1-142382
Jun. 5, 1989 [JP] Japan ............... 1-142383

[51] Int. Cl.$^5$ .................... H05K 7/02; H05K 7/10
[52] U.S. Cl. .................... 361/760; 174/260; 257/723; 439/68; 361/748; 361/778; 361/805; 361/807
[58] Field of Search ............... 361/416, 417, 393, 395, 361/397, 400, 403, 407, 409, 410, 413, 418, 419, 420; 439/48–54, 68, 85, 516, 69–73; 174/250, 253, 255, 260, 261; 257/723, 725, 777, 778

[56] References Cited

U.S. PATENT DOCUMENTS

| | | | |
|---|---|---|---|
| 3,175,179 | 3/1965 | Trump ................... | 439/48 |
| 3,668,604 | 6/1972 | Rossman ................ | 439/70 |
| 4,125,309 | 11/1978 | Grantiz et al. .......... | 439/48 |
| 4,488,354 | 12/1984 | Chan et al. . | |
| 4,552,422 | 11/1985 | Bennett et al. ......... | 361/400 |
| 4,613,924 | 9/1986 | Brault ................... | 174/260 |
| 5,016,086 | 5/1991 | Inoue et al. ........... | 381/395 |

FOREIGN PATENT DOCUMENTS

| | | |
|---|---|---|
| 2755550 | 6/1979 | Fed. Rep. of Germany ...... 439/68 |
| 0105860 | 5/1986 | Japan ............................. 357/75 |
| WO83/03318 | 9/1983 | PCT Int'l Appl. . |
| WO90/04233 | 4/1990 | PCT Int'l Appl. . |
| WO90/09639 | 8/1990 | PCT Int'l Appl. . |
| 2180382A | 3/1987 | United Kingdom . |

OTHER PUBLICATIONS

VLSI Systems Design Jul. 1988, pp. 3–8.
Benefits of In-Circuit Re-Programmable Logic Devices—Landry 8079 Electro/86 and Mini/Micro Northeast 11 (1986) Conf. Record Los Angeles, Calif.—pp. 1–9.

*Primary Examiner*—Leo P. Picard
*Assistant Examiner*—Donald Sparks
*Attorney, Agent, or Firm*—Oliff & Berridge

[57] ABSTRACT

There is provided a configurable electronic circuit board which comprises a board including many modular sockets in a minimum unit each having a size and the number of pins both standardized, the modular sockets being arranged regularly parallely and connected to each other at terminals thereof through simple wirings, a pin adapter composed of adapter pins insertable into the modular socket, of an adapter socket into which electronic circuit parts are insertable, and of socket wirings for making connection between the adapter socket and the adapter pins, a switching station adapter composed of adapter pins insertable into the modular socket, and of a wiring changeover switch and a fuse for determining the connection of wiring among the adapter pins, and a bypass adapter being inserted into a modular socket not used, and composed of adapter pins insertable into the modular socket, and of fixed wiring for simply bypass-connecting among the adapter pins, whereby an arbitrary circuit is realizable by inserting each adapter or electronic circuit part into an arbitrary modular socket. The configurable electronic circuit board is used to realize and verify a designed circuit.

11 Claims, 16 Drawing Sheets

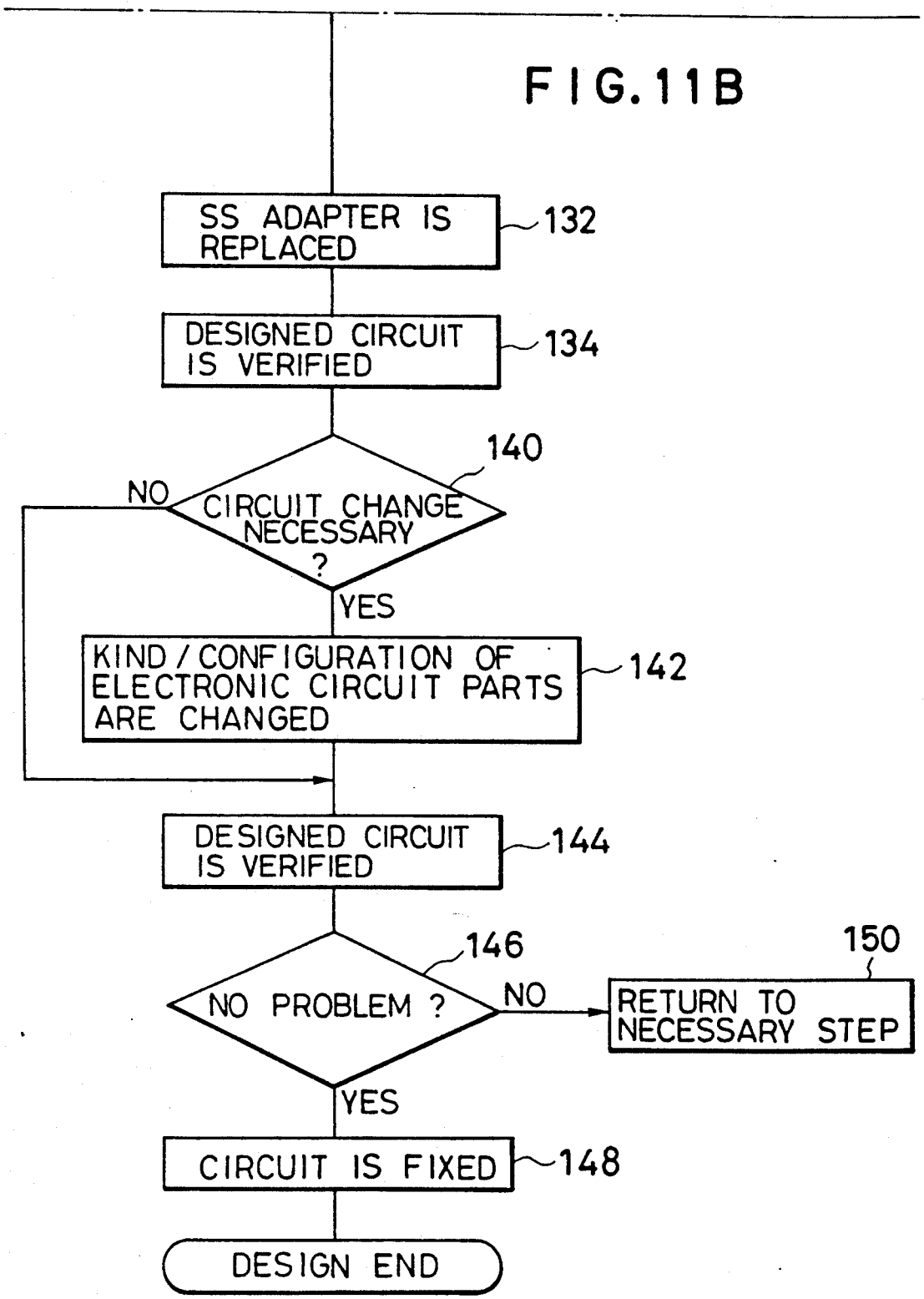

F I G. 14
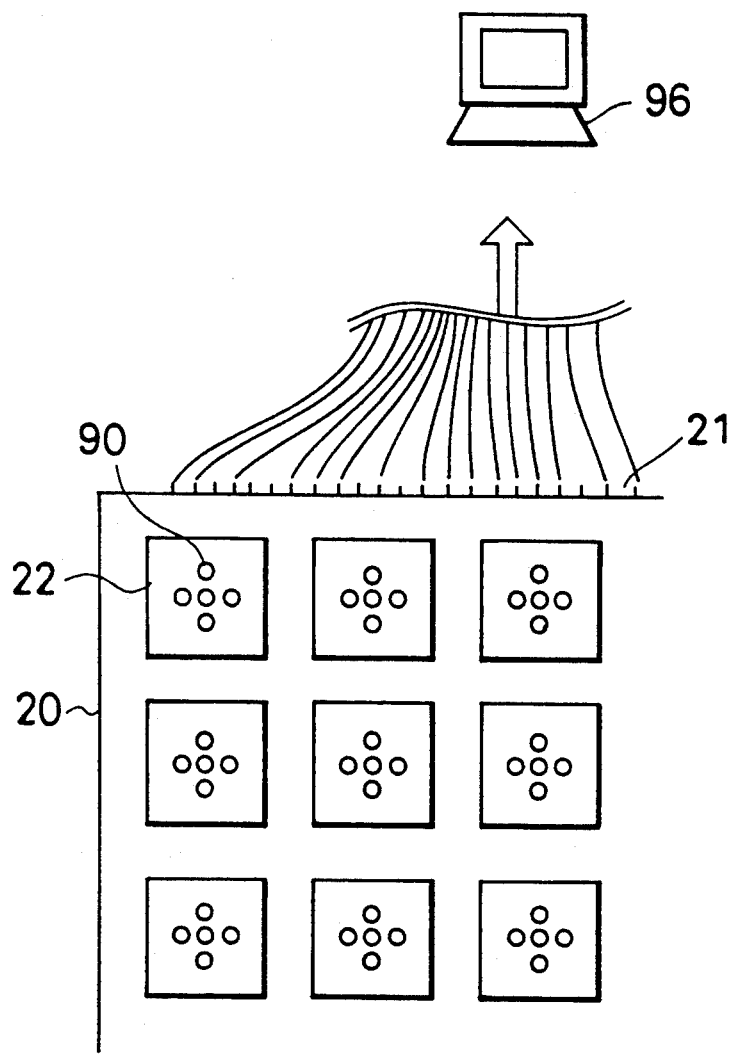

CONFIGURABLE ELECTRONIC CIRCUIT BOARD ADAPTER THEREFOR, AND DESIGNING METHOD OF ELECTRONIC CIRCUIT USING THE SAME BOARD

This is a continuation of application Ser. No. 07/531,061 filed May 31, 1990, now abandoned.

BACKGROUND OF THE INVENTION

1. Field of the Invention

The present invention relates to a configurable electronic circuit board, an adapter for the same, and a designing method of an electronic circuit using the board, and more specifically to a configurable electronic circuit board being capable of realization of an arbitrary actual circuit with ease and being preferable for use in verification and testing of a designed system with use of an actual circuit upon designing a VLSI (very large scale integrated circuit) system composed of one or a plurality of chips of VLSIs, and related to an adapter for the configurable electronic circuit board and to a designing method of an electronic circuit using the configurable electronic circuit board.

2. Description of the Prior Art

Generally, in a design of VLSI system verification and testing thereof are time-consuming. Because much time is required for computation of various simulations by a computer and of fault simulation, the fault being produced as a result of modeling of an actual circuit.

To solve the problems, it has been proposed to perform the verification and testing of such a system using an actual circuit.

For such an actual circuit, a bread board comprising a one-board computer for example is known which is constructed, as illustrated in FIG. 27 for example, by disposing on a system board 16 a chip of a central processing unit (CPU) 10 and a peripheral circuit composed of varieties of general-purpose integrated circuits (IC) 12 such as TTLs, RAMs, ROMs and the like and of programmable logic devices (PLD) 14 for use in decoding of any address and the like, in combination for each system design, and by wiring by soldering with use of printed wiring and jumper wiring.

The design of such an exclusive bread board constructed for each system, which requires a large scale of integration and many logic circuits incorporated therein, takes plenty of time and costs a great deal to form a bread board equivalent to the system as well as suffers from a difficulty, once the system is altered, of correcting it correspondingly.

To solve such problems, an electronic device is disclosed in Japanese Laid-Open Patent Publication No. 63-49831 wherein internal wirings are freely altered at need to realize varieties of logic functions by incorporating a memory device for defining a connection relation among a plurality of logic devices and making rewritable the contents of the memory devices externally.

Additionally, another electronic device is disclosed in Japanese Laid-Open Patent Publication No. 63-50999 wherein internal wirings are freely altered at need to realize varieties of logic functions by providing fuses for defining a connection relation among a plurality of logic devices and fusing the fuse externally.

In the electronic devices described above, sockets are provided for disposing logic devices such as programmable read only memories (PROMs) and MSIs, etc., and wirings are laid for connecting those sockets lengthwise and crosswise, and further wiring exchange devices are disposed at intersections between those wirings, thus assuring arbitrary exchange of the wirings.

The wiring exchange device itself, however, does not include any socket so that it is impossible to omit such a wiring exchange device or mount electronic parts at a position where the wiring exchange device is located and further it is impossible to operate an associated circuit so far as electronic parts are not attached to all sockets.

Additionally, for constructing an one-board computer using PLDs as illustrated in FIG. 28, for example, there may be an occasion in which various sizes of PLDs are mounted on the same board and wired for effective use. For example, a small-scale PLD (S PLD) 14A is required if it corresponds to a small-scale general-purpose IC, or a large-scale PLD (L PLD) 14B is necessary if it corresponds to a large-sized general-purpose IC or an integration of small-scale PLDs 14A. However, in the prior art, electronic circuit parts of different sizes such as a CPU or a large-scale PLD or the like, which are not adapted to fit in typical sockets, fail to be mounted on the electronic device.

Additionally, electronic circuit parts and wiring exchange devices are fixed positionally, making it difficult to alter mutual positions. It is therefore impossible in the prior art to realize an arbitrary circuit.

Moreover, a testing method of an electric circuit composed of electronic devices including a logic integrated circuit removably attached to a socket is disclosed in Japanese Laid-Open Patent Publication No. 56-26269 wherein a dummy circuit instead of the logic integrated circuit is attached to a socket for testing characteristics of the circuit.

In the testing method, however, only a peripheral circuit except for the logic integrated circuit can be tested, but the whole circuit including the logic integrated circuit can not be tested.

Furthermore, in the aforementioned bread board, when wiring and connection are performed with use of a transfer gate liable to be altered in configuration, a system clock can not be raised owing to the delayed operation of the transfer gate resulting in greater delay compared with a complete system.

To solve such difficulty, there is disclosed a method of cooling a system in Japanese Laid-Open Patent Publication No. 63-234174 which requires a cooling device and hence is large-sized.

SUMMARY OF THE INVENTION

In view of the drawbacks with the prior art, it is a first object of the present invention to provide a highly general-purposed configurable electronic circuit board capable of arranging electronic circuit parts of an arbitrary size at an arbitrary position, of exchanging the position of the electronic circuit parts and that of wiring determining means, and of operating an associated circuit even if there is any location where the electronic circuit parts or the wiring determining means is not existent.

A second object of the present invention is to provide a configurable electronic circuit board capable of multilayer wiring and of altering the connection of the multilayer wiring with ease.

A third object of the present invention is to provide a configurable electronic circuit board capable of easily distinguishing the kinds and positions of electronic circuit parts and adapters mounted on sockets.

A fourth object of the present invention is to provide a pin adapter for the configurable electronic circuit board capable of disposing electronic circuit parts of an arbitrary size at an arbitrary position on the board.

A fifth object of the present invention is to provide a switching station adapter for the configurable electronic circuit board capable of determining wiring connection at an arbitrary position on the board.

A sixth object of the present invention is to provide a bypass adapter for the configurable electronic circuit board capable of constructing an electronic circuit with ease even if there is any portion on the board where the electronic circuit parts and the wiring determining means are unnecessary.

A seventh object of the present invention is to provide a designing method of an electronic circuit with use of the configurable electronic circuit board, capable of designing the electronic circuit with testing of the whole circuit.

A eighth object of the present invention is to provide a designing method of an electronic circuit with use of the configurable electronic circuit board, in which a problem of its delayed operation owing to a transfer gate has been solved, in a later half stage of a design in which wiring among electronic circuit parts has been determined.

To achieve the first object, a configurable electronic circuit board according to the present invention comprises a board including many modular sockets in a minimum unit each having a standardized size and the standardized number of pins and arranged regularly parallely and further connected at terminals thereof to each other through simple wirings; a pin adapter having a size positive integer times of the size of said modular socket and composed of adapter pins insertable into said modular socket, of an adapter socket into which electronic circuit parts are insertable, and of socket wirings for connecting said adapter socket with said adapter pins; a switching station adapter having a size positive integer times of the size of said modular socket and composed of adapter pins insertable into said modular socket, and of wiring determining means for determining the connection of wiring among said adapter pins; and a bypass adapter having a size positive integer times of the size of said modular socket and being inserted into a modular socket not used, composed of adapter pins insertable into said modular socket and of fixed wiring for simply bypass connecting among said adapter pins, whereby an arbitrary circuit is realizable by inserting each said adapter or the electronic circuit parts into an arbitrary modular socket.

Additionally, in the foregoing configurable electronic circuit board, said modular socket can have a size and the number of pins for which electronic circuit parts of a standard size and the standard number of pins are directly insertable therein without use of said pin adapter.

To achieve the second object, a configurable electronic circuit board according to the present invention comprises surface layer wiring for connecting terminals of adjacent modular sockets; under layer wiring for directly connecting terminals of separated modular sockets; and a wiring changeover switch for connecting between terminals of the modular socket and said surface layer wiring or said underlayer wiring.

Additionally, in the foregoing configurable electronic circuit board, said surface layer wiring and said under layer wiring can be both connected to the terminals of the modular socket, and said switching station adapter can include therein said wiring changeover switch.

To achieve the third object, a configurable electronic circuit board according to the present invention comprising at least one socket capable of selectively inserting thereinto a plurality of kinds of electronic circuit parts or adapters, further comprises detector means provided on said socket for detecting the kind of the electronic circuit parts or of the adapter inserted into said socket, whereby the kind and position of the inserted electronic circuit parts or of the adapter are made distinguishable simultaneously with the insertion of the electronic circuit parts or the adapter.

Additionally, in the foregoing configurable electronic circuit board, said detector means can include a switch for detecting the kind of said adapter or of said electronic circuit parts by making use of a dog provided on the bottom of said adapter or said electronic circuit parts.

In accordance with the present invention, there are provided on the board many modular sockets in a minimum unit each having a size and the number of pins both standardized, and arranged parallely and further connected among terminals thereof through simple wirings.

Accordingly, an arbitrary circuit is realizable without limitation thereto by the size and positions of the electronic circuit parts, wiring determining means, and empty parts, by inserting into an arbitrary modular socket the electronic circuit parts, pin adapter, switching station adapter, and bypass adapter all of sizes being equal to or integer times of the size of the modular socket. Therefor, highly general-purposed configurable electronic circuit board can be obtained.

Herein, said pin adapter can include adapter pins insertable into the modular socket, an adapter socket into which electronic circuit parts such for example as a central processing unit and a programmable logic device, etc., are insertable, and socket wiring for connecting between terminals of said adapter socket and adapter pins, and has a size thereof integer times of said modular socket which is fitted to the size of such electronic circuit parts.

Additionally, said switching station adapter can include adapter pins insertable into the modular socket and wiring determining means for determining the connection of wirings among said adapter pins, for the purpose of determining the connection of wirings among said modular sockets.

Moreover, said bypass adapter can include adapter pins insertable into the modular socket and fixed wiring for simply bypass-connecting across said adapter pins, and is inserted into a modular socket not used for bypass-connecting between front and back wirings and between right and left wirings.

It is therefore possible to arrange arbitrary size electronic circuit parts on the board without limitation thereto by the size of the modular socket by defining the size of said pin adapter as integer times of the modular socket so as to fit the same to the size of such electronic circuit parts. Particularly, if the modular socket is defined as having the size and number of pins for which electronic circuit parts of a standard size and of the standard number of pins, for example, small-sized PLDs are directly insertable into the modular socket without use of said pin adapter, a pin adapter for such a small-sized PLD may be omitted to reduce the number of adapters to be used.

Still more, not only the pin adapter but also the switching station adapter and the bypass adapter are insertable into an arbitrary modular socket, thereby assuring the very high flexibility of the circuit.

There is further included the bypass adapter inserted into the modular socket not used, so that all electronic circuit parts are not necessarily needed to be arranged on the board and hence even a small-sized system can be constructed.

In the case where there are included on said board the surface layer wiring for making connection between terminals of adjacent modular sockets, the lower layer wiring for making direct connection between terminals of separated modular sockets, and the wiring change-over switch for selectively connecting any of the surface layer wiring and the under layer wiring to the terminal of the modular socket, the separated modular sockets can be directly connected through a long line, and the surface layer wiring and the lower layer wiring are made arbitrary selectable to further improve the general-purpose property. The long line is also useable as a bus line.

In the case where said surface layer wiring and said lower layer wiring are connected together to the terminal of the modular socket and said switching station adapter includes therein said wiring changeover switch, there is no need of providing separated wiring change-over switch on the board.

In the case where there is provided said detector means for detecting the kind of electronic circuit parts and adapter, the kind and position thereof are distinguishable at the same time as the electronic circuit parts or the adapter is inserted, thereby omitting an operation of inputting instructions into a development tool anew.

Furthermore, in the case where said detector means includes the switch for detecting the kind of said adapter and said electronic circuit parts through the dog provided on the bottom surface thereof, the construction of said detector means is simplified.

To achieve the fourth object of the present invention, an adapter for insertion into a modular socket of the configurable electronic circuit board according to the present invention, the board including many modular sockets in a minimum unit each having a standardized size and the standardized number of pins, the modular sockets being arranged parallely regularly and connected among terminals thereof through simple wirings, said adapter has a size positive integer times of said modular socket and comprises adapter pins insertable into said modular socket, an adapter socket into which electronic circuit parts is insertable, and socket wiring for making connection between the terminals of said adapter socket and the adapter pins.

To achieve the fifth object, the like adapter for the configurable electronic circuit board has a size positive integer times of said modular socket and comprises adapter pins insertable into said modular socket, and wiring determining means for determining the connection of wiring among said adapter pins.

In accordance with the present invention, said wiring determining means can further allow said adapter pins to be connected through metal.

In accordance with the present invention, said wiring determining means can further include a wiring change-over switch for making connection between the terminals of said modular socket and the surface layer wiring or the under layer wiring of the electronic circuit board.

To achieve the sixth object of the present invention, the like adapter for the configurable electronic circuit board has a size positive integer times of said modular socket and comprises adapter pins insertable into said modular socket, and fixed wiring for simply bypass-connecting among said adapter pins, and is insertable into a modular socket not used.

In accordance with the present invention, there is further included distinguishing means for distinguishing the kind of said adapter or electronic circuit parts mounted on said adapter.

The configurable electronic circuit board intended for use with the adapters according to the present invention comprises many modular sockets in a minimum unit each having a size and the number of pins both standardized and arranged parallely and further connected among terminals thereof through simple wirings. It is therefore possible to realize an arbitrary circuit without limitation thereto by the sizes and positions of the electronic circuit parts, wiring determining means, and empty parts by inserting the pin adapter, switching station adapter, bypass adapter according to the present invention into an arbitrary modular socket.

Herein, said pin adapter of the present invention for mounting arbitrary electronic circuit parts, comprises the adapter pins insertable into said modular socket, the adapter socket into which electronic circuits parts such for example as a central processing unit and a programmable logic device, etc., are insertable, and the socket wirings for connecting terminals of said adapter socket and the adapter pins, and has a size positive integer times of that of said modular socket, fitted to the size of the electronic circuit parts. It is therefore possible to dispose arbitrary size electronic circuit parts on the board at an arbitrary position of the same without limitation thereto by the size of the modular socket and is very easy to alter the same.

Additionally, said switching station adapter of the present invention for determining the connection of the wiring between said modular sockets includes the adapter pins insertable into said modular socket, and the wiring determining means for determining the connection of the wirings among said adapter pins, and has the size thereof integer times of that of said modular socket. It is therefore possible to determine the connection of any wiring at an arbitrary position on the board.

In the case where said wiring determining means is adapted to connect said adapter pins through a metal, there is improved delayed transmission to raise a system clock and the like.

Additionally, in the case where said wiring determining means includes the wiring changeover switch for connecting between the terminals of said modular socket and the surface layer wiring or under layer wiring of the electronic circuit board, there is no need of providing separated wiring changeover switch on the board.

Said bypass adapter of the present invention that is inserted into a modular socket not used includes the adapter pins insertable into the modular socket and the fixed wirings for simply bypass-connecting among said adapter pins and has the size thereof integer times of that of said modular socket. Accordingly, even if there is any portion where the electronic circuit parts and the wiring determining means are not existent on the board, the circuit can be operated. It is therefore unnecessary to dispose all electronic circuit parts on the board and possible to construct even a small system.

In the case where there is provided the distinguishing means for distinguishing the kind of said adapter or electronic circuit parts mounted on said adapter, it is possible to distinguish the kind and position of the electronic circuit parts or the adapter simultaneously with insertion of the same, thereby enabling operation of again inputting associated instructions into a development tool to be omitted.

To achieve the seventh object of the present invention, the designing method of an electronic circuit according to the present invention employs the configurable electronic circuit board comprising the board including many modular sockets in a minimum unit each having a standardized size and the standardized number of pins and arranged parallely regularly and further connected among terminals thereof through simple wirings, the pin adapter having a size positive integer times of that of said modular socket and composed of adapter pins insertable into said modular socket, of an adapter socket into which electronic circuit parts are insertable, and of socket wirings each connecting between said adapter socket and said adapter pins, the switching station adapter having a size thereof positive integer times of that of said modular socket and composed of adapter pins insertable into said modular socket and of the wiring determining means for determining the connection of wirings among said adapter pins, and the bypass adapter being inserted into a modular socket not used and having a size thereof positive integer times as that of said modular socket, and composed of the adapter pins insertable into said modular socket, and of the fixed wirings for simply bypass-connecting among said adapter pins, whereby an arbitrary circuit is realizable by inserting each adapter or electronic circuit parts into the arbitrary modular socket, the method further comprises, as exemplarily illustrated by steps 110 to 120 and 140 to 144 in FIG. 11, the steps of mounting the required respective adapter or electronic circuit parts in a selective combination on the modular socket on said board, of realizing and verifying a designed circuit by configuring the electronic circuit parts and said switching station adapter for which configurations of internal circuits are required, of dealing, for verification of the designed circuit, when any wiring alteration is necessary among the electronic circuit parts, with this by positional alteration of said adapter or electronic circuit parts or configuration alteration in said switching station adapter, and of dealing, for verification of the designed circuit, when any circuit alteration is necessary, with this by the alteration of the kind of the electronic circuit parts or configuration alteration.

Further, to achieve the eighth object of the present invention, the designing method of an electronic circuit using the configurable electronic circuit board according to the present invention comprises, as exemplarily illustrated by steps 110 and 130 to 134 in FIG. 11, the steps of employing, as said switching station adapter, one which is capable of reconfiguration until wirings among the electronic circuit parts are decided, and of substituting the same for one which is connectable among the adapter pins directly through metal after the wirings among the electronic circuit parts have been decided for verification of a designed circuit.

Additionally, in the designing method, said switching station adapter which is connectable among the adapter pins directly through metal wires is formed as an only one time-configuration type using a programmable shunt, a process of cutting wire off by laser trimmer, a process of cutting off a fuse, or a process of making it electrically low resistance by application of high voltage thereto.

In accordance with the present invention, a designed circuit is realized with use of the board including many modular sockets in a minimum unit each having a standardized size and the standardized number of pins; the modular sockets being arranged regularly parallely and connected among terminals thereof to each other through simple wirings. An arbitrary designed circuit can therefore be realized without limitation thereto by the sizes and positions of the electronic circuit parts, wiring determining means and empty parts by, in the initial stage of the design, selectively combining the electronic circuit parts, pin adapter, switching station adapter, and bypass adapter all of sizes equal to or integer times of that of the modular socket for mounting them on the modular sockets of the board, and configuring the switching station adapter and electronic circuit parts such as a PLD for which configuration of its internal circuit is required. Thus, said configurable electronic circuit board can be used to realize an arbitrary designed circuit, conducting testing on the whole circuit.

Herein, in the case where there is employed as said switching station adapter that is capable of reconfiguration until wirings among the electronic circuit parts are decided, and the same is substituted for one that is connectable among the adapter pins directly through metal wires after the wirings among the electronic circuit parts have been decided, for verification of a designed circuit, in the latter half stage of the design the delayed operation of the configurable electronic circuit board due to the transfer gate is avoided to increase the rate of the system clock and the like whereby the designed circuit is operated at a high speed, approximately a speed achieved by a complete system, for verification thereof.

For the switching station adapter which is connectable among the adapter pins directly through metal wires, there is available a known device (electronic circuit product) which performs the configuration only one time by making use of a programmable shunt, a cutting method using a laser trimmer, a method of cutting off fuses, a high voltage application method where voltage is applied among the adapter pins for making the connection portions among the adapter pins electrically low resistance, and the like.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein:

FIG. 14 is a plan view illustrating the construction of a portion of a board used in a fourth embodiment of the same;

DESCRIPTION OF THE PREFERRED EMBODIMENTS

In what follow, preferred embodiments of the present invention will be described with reference to the accompanying drawings.

Figure 1:
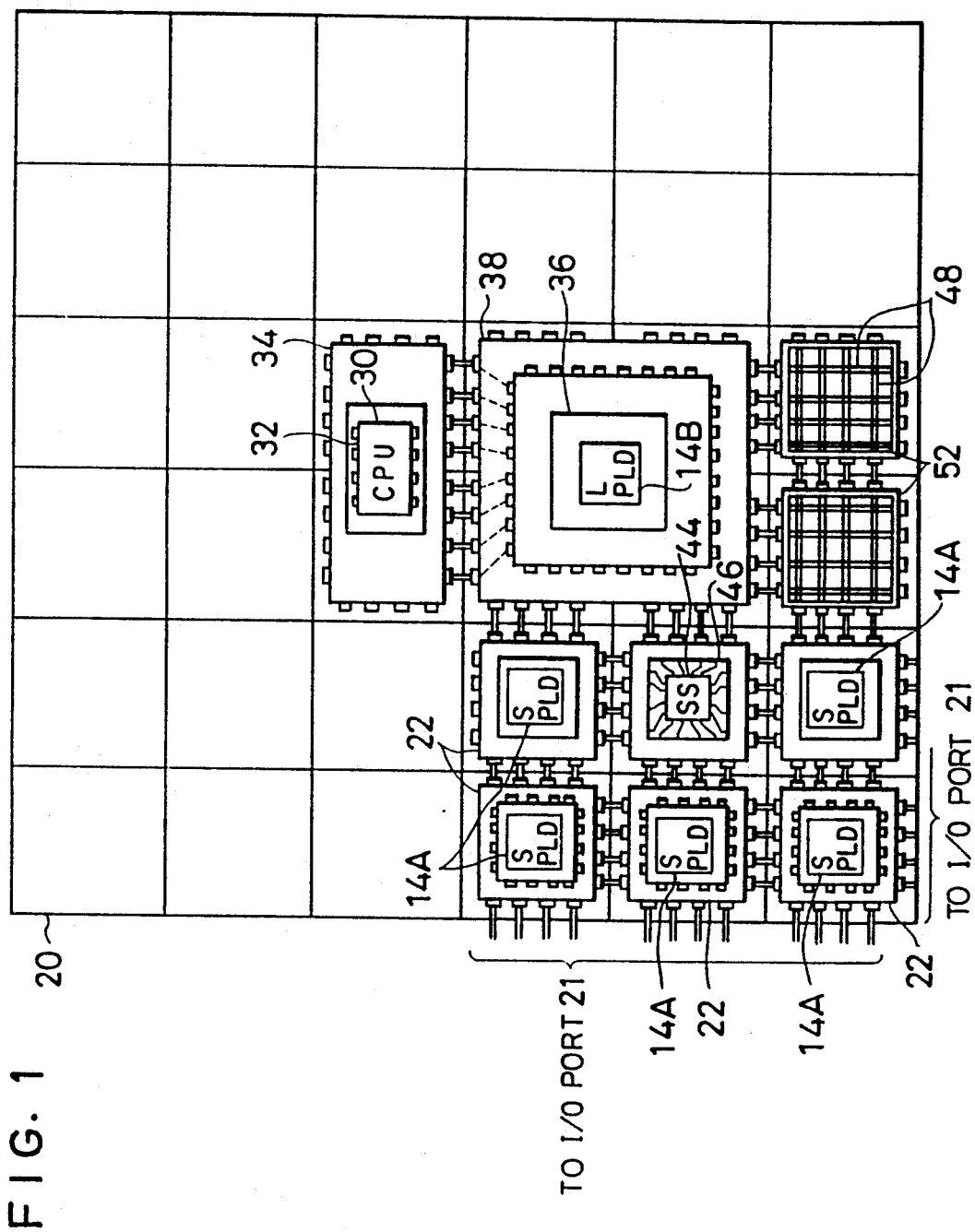
FIG. 1 is a plan view illustrating a portion of a first embodiment of a configurable electronic circuit board according to the present invention.
Figure 2:
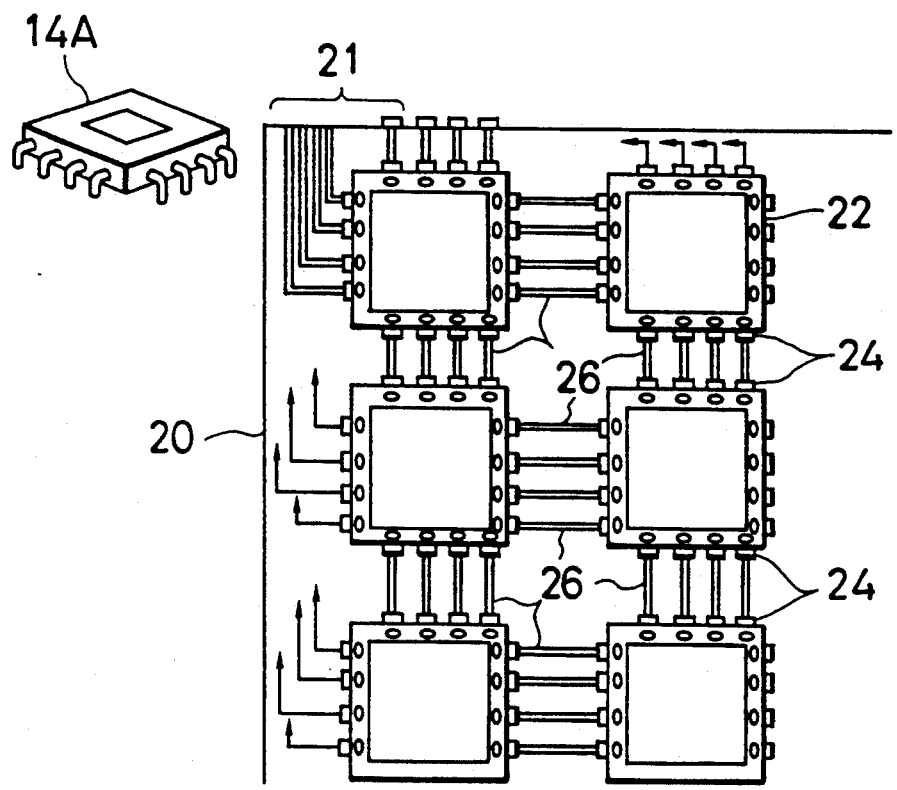
FIG. 2 is a plan view illustrating the configuration of the portion of a board used in the first embodiment.

Referring to FIGS. 1 and 2, a first embodiment of a configurable electronic circuit board according to the present invention is illustrated.

The first embodiment comprises a board 20 including many modular sockets 22 in a minimum unit each having such a size and the number of pins that a small PLD (S PLD) 14A is directly insertable into each modular socket, the modular sockets 22 being arranged regularly parallely and connected between terminals 24 thereof through simple wirings (wirings 26 extending vertically and horizontally as shown in FIG. 2 in the present embodiment), a pin adapter 34 for CPU having a size thereof positive integer times (twice in the present embodiment) of that of the modular socket 22 and including an adapter socket 32 into which a central processing unit (CPU) 30 is insertable, a pin adapter 38 for a large-scale PLD, the adapter 38 having a size thereof positive integer times (four times in the present embodiment) of that of the modular socket 22 and including an adapter socket 36 into which the large PLD (L PLD) 14B is insertable, an SS (switching station) adapter 46 having a size positive integer times (one time in the present embodiment) of that of the modular socket 22 and including wiring determining means (switching station) (SS) 44 for determining the connection of wirings among the modular sockets 22, and bypass adapters 52 each having a size thereof positive integer times (one time in the present embodiment) of that of the modular socket 22, and being inserted into a modular socket not used and including fixed wirings 48 for simply bypass-connecting upper and lower wirings and left and right wirings, whereby an arbitrary computer circuit is realizable by inserting the small PLD 14A or each adapter 34, 38, 46, 52 into an arbitrary modular socket 22.

Figure 3:
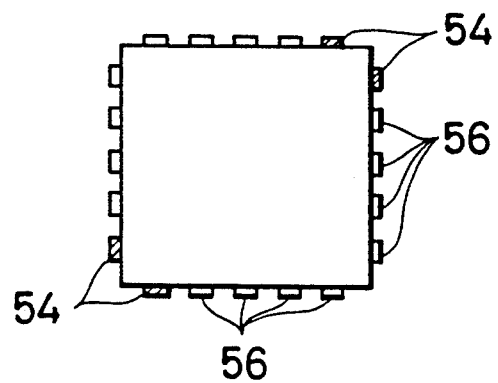
FIG. 3 is a plan view illustrating the actual situation of each adapter in the first embodiment.

Herein, pins 54 for configuring an internal circuit are provided besides ordinary adapter pins 56 as shown in FIG. 3 (not illustrated in FIG. 1), to each modular socket 22 and an adapter, on which electronic circuit parts are mounted with a requirement for the configuration of an internal circuit such as the large PLD 14B, and the switching station 44, etc.

The foregoing board 20 includes, as illustrated in detail in FIG. 2, many modular sockets 22 in a minimum unit each having such a size and the number of pins that the small PLD 14A is directly insertable into the modular socket 22, the modular sockets 22 being arranged regularly parallely and connected to each other at terminals 24 thereof through simple wirings 26. Terminals of the modular sockets 22 located along the periphery of the same are connected to an I/O port 21 of the board 20. Herein, the modular sockets 22 are connectable to each other through the vertical and horizontal simple wirings 26 as described above. The reason is that the wirings between the terminals 24 are made configurable with the aid of the switching station 44 mounted on the SS adapter 46, of the small PLD 14A, and of the large PLD 14B mounted on the pin adapter 38, etc.

Figure 4:
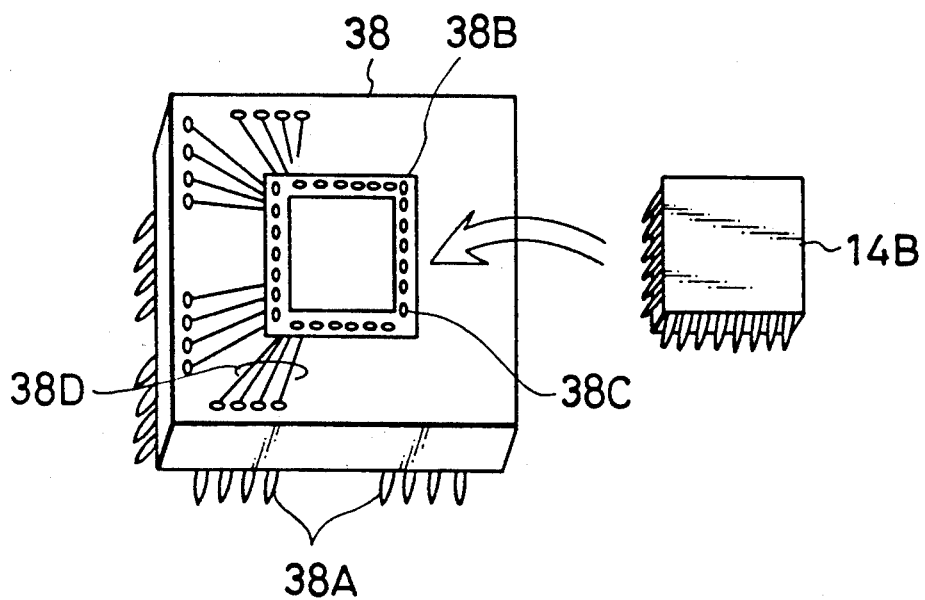
FIG. 4 is a perspective view illustrating the configuration of a pin adapter for a large PLD used in the first embodiment.
Figure 5:
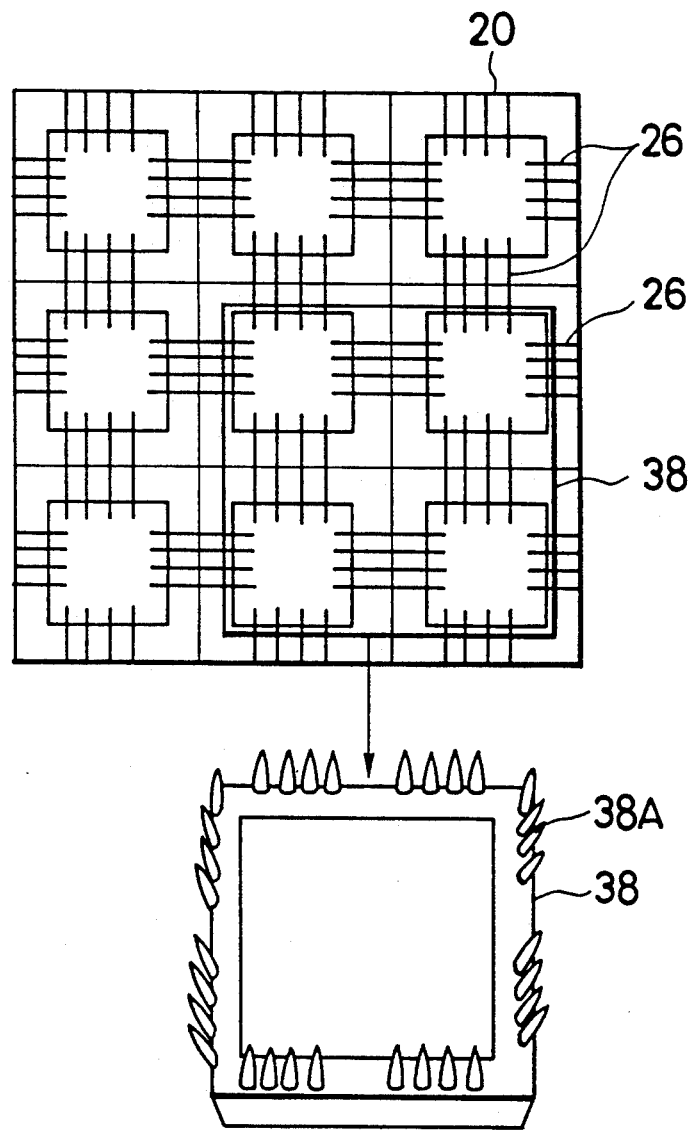
FIG. 5 is a view illustrating how the large PLD pin adapter is inserted into the board.

The pin adapter 38 for the large PLD according to the present invention, that is to mount thereon the large PLD 14B or a middle-scale PLD or the like, all not directly insertable into the modular socket 22, comprises, as illustrated in detail in FIG. 4, adapter pins 38A insertable into the modular socket 22, an adapter socket 38B into which the large PLD 14B for example is insertable, and socket wirings 38D for making connection between terminals 38C of the adapter socket 38D and the adapter pins 38A. The adapter pins 38A are disposed to fit in holes in the modular socket 22, and the one large PLD pin adapter 38 is mounted on the board 20 using for example four adjacent modular sockets 22 as illustrated in FIG. 5.

Figure 6:
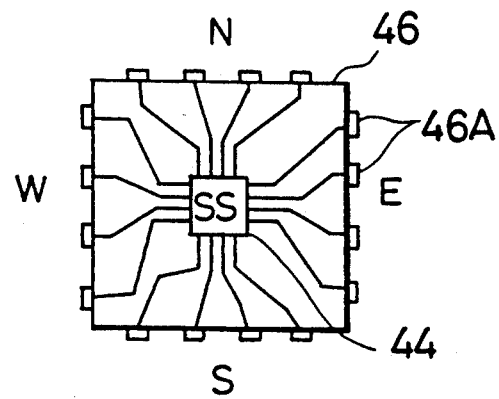
FIG. 6 is a plan view illustrating the construction of a switching station (SS) adapter used in the first embodiment.

The foregoing SS adapter 46 according to the present invention includes, as illustrated in detail in FIG. 6, adapter pins 46A insertable into the modular socket 22 and a switching station 44 for determining the connection of wirings among the adapter pins 46A, whereby the connections in the respective direction (N, W, S, E) are configurable by configuring the switching station 44.

Figure 7:
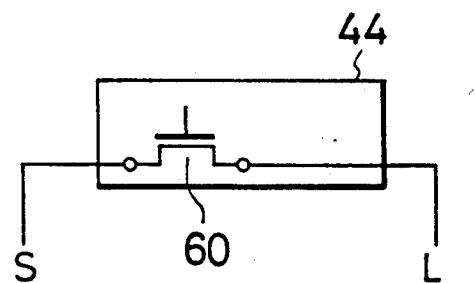
FIGS. 7 to 9 are circuit diagrams each exemplarily illustrating the internal construction of the foregoing SS adapter.

For the switching station 44, there is available one including a transfer gate 60 provided between a source pin S and a load pin L, as illustrated in FIG. 7 for example, until wirings is decided in the initial stage of the design. In this situation, reconfiguration is possible after the wiring connection is once determined. Herein, in the case where all directions of N, W, S and E are made programmable, there can be provided two or more of transfer gates, three of the transfer gates 60N, 60W and 60S in the present case, between the source pin S (N for example) and the load pin L (W, S, E for example), as illustrated FIG. 8 for example.

Figure 9:
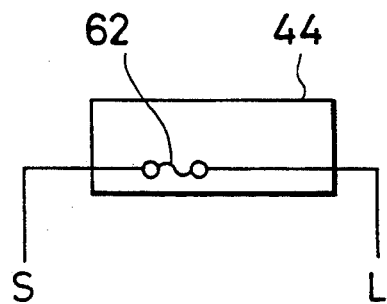

Additionally, after the wiring is decided in the latter half stage of the design, there may be available one including a fuse 62 as illustrated in FIG. 9 for example, as the switching station 44 instead of the transfer gate. In this situation, once the fuse 62 is burned off for configuration, although later alteration of the configuration is impossible, there can be avoided the difficulty of the delayed transmission through a transfer gate, so that any trouble which might be caused by such delayed transmission upon raising the system clock can be prevented to enable verification of the designed circuit to be performed at the same high speed as a complete system.

Herein, for the wiring determining means, that is connectable between the source pin S and the load pin L directly through metal without use of such a transfer gate, some techniques are available without limitation to the just-mentioned fuse, such for example as one using a programmable shunt as disclosed in Japanese Patent Publication No. 56-16556, one of cutting off the wiring with a laser trimmer, one of applying high voltage to the wiring to make electrically low resistance in contrast to the fuse, and the like. In the case where all directions of the wirings are desired to be programmable, many fuses 62 and the like may be available correspondingly to the number of the transfer gates, as in the case shown in FIG. 8.

Figure 10A:
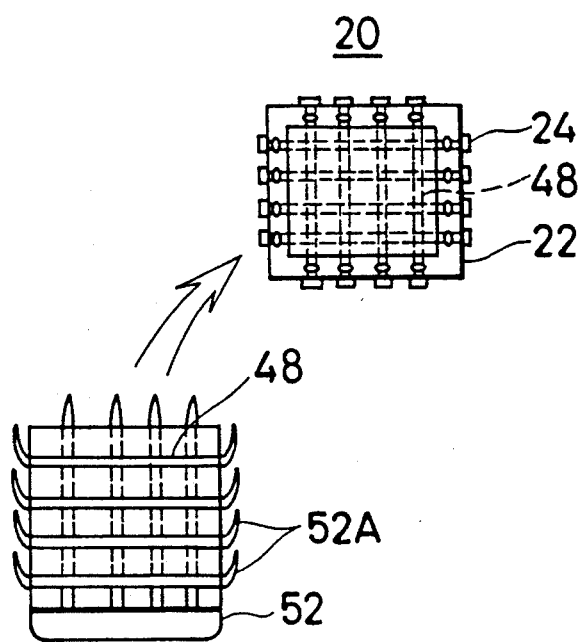
FIG. 10A is a view illustrating the construction of a bypass adapter used in the first embodiment as well as the situation of the same as mounted on the board.

Additionally, for the aforementioned bypass adapter 52, one illustrated in FIG. 10A in detail may be useable, which includes adapter pins 52A insertable into the modular socket 22, and fixed wirings 48 of a double layered structure, one extending vertically and the other horizontally, for simply bypass-connecting among the adapter pins 52A, whereby vertical and horizontal wirings are independently achieved by its insertion into a modular socket not used.

With use of the bypass adapter 52, even a relatively small system can be realized without the need of disposing PLDs on all modular sockets 22.

Figure 10B:
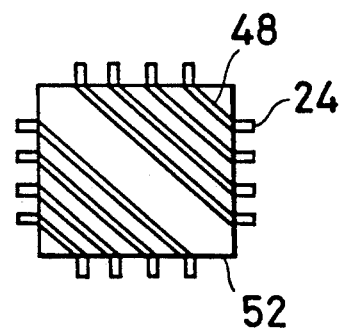
FIG. 10B is a bottom view illustrating the construction of another example of the bypass adapter.

FIG. 10B shows a bottom view of another example of the bypass adapter 52 which can be preferably used at corner positions.

Figures 11, 11A, 11B:
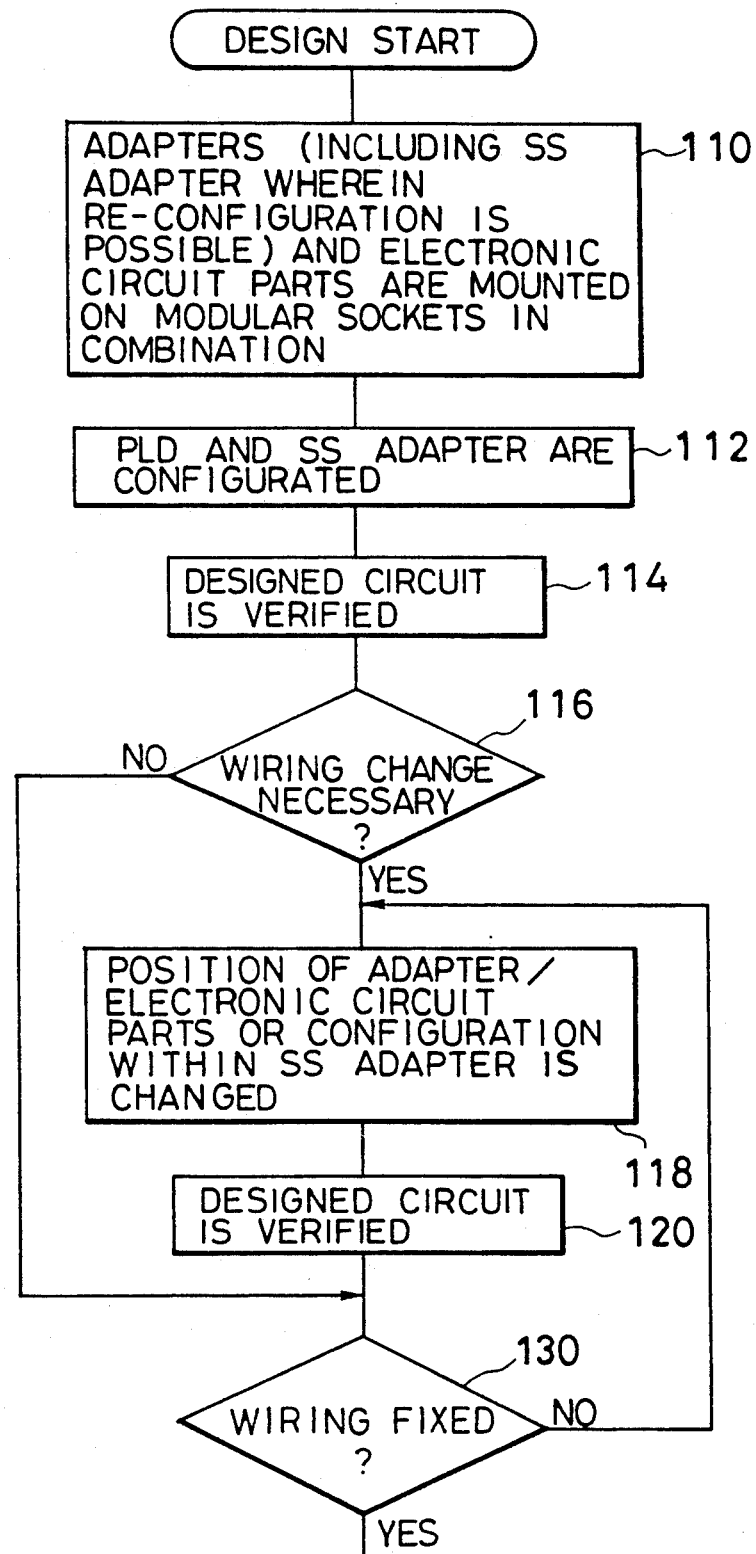
FIGS. 11A and 11B are flow chart illustrating the procedures of an embodiment of a designing method of an electronic circuit according to the present invention with use of the configurable electronic circuit board of the first embodiment.

In the following, procedures of a designing method of an electronic circuit according to the present invention which employs the first embodiment of the configurable electronic circuit board shown in FIG. 1 will be described with reference to FIG. 11.

Figure 8:
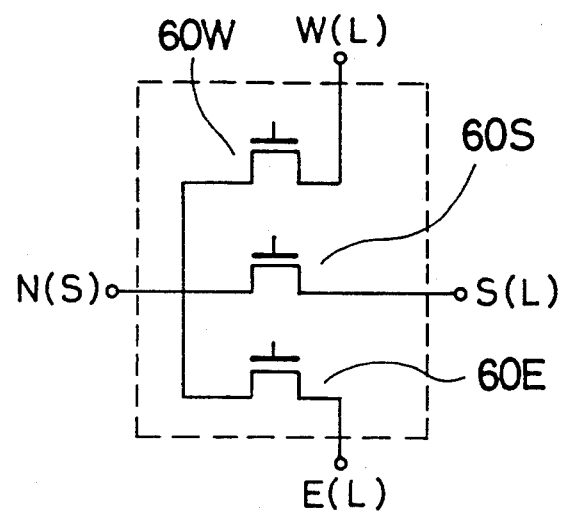

For designing an electronic circuit according to the present invention, first, in step 110, the respective adapters and the electronic circuit parts (small PLD 14A), which are required according to the designed circuit, are combined and mounted on the modular socket 22 on the board 20. Herein, for the SS adapter 46, it is desirable to employ such one as illustrated in FIG. 7 and 8 which incorporates a transfer gate and is re-configurable.

In succession, in step 112, the designed circuit in the initial stage of the design is realized by configurating the PLDs 14A, 14B and the SS adapter 46 that require the configuration of the internal circuits thereof, and, in step 114, the realized circuit is verified. Herein, with a configurable electronic circuit board employing a general-purpose IC for example and not including any PLD, configuration of any PLD is not required.

When wiring alteration is necessary among the electronic circuit parts as a result of the verification (step 116), in step 118 the position of the adapter or the small PLD 14A is altered or the configuration in the SS adapter 46 is altered, and in step 120 the designed circuit is re-verified.

When the wirings among the electronic circuit parts have been decided (step 130), in step 132 the SS adapter 46 is replaced by one as illustrated in FIG. 9, which is connectable among the adapter pins directly through metal using a fuse for example. Successively, in step 134, the designed circuit allowed to operate at a high speed is verified.

When circuit alteration is required as a result of the verification (step 140), in step 142 the kind of the electronic circuit parts is altered or the configuration of any PLD, if it is employed, is altered, and in step 144 an altered circuit is verified.

When there is no problem as result of the verification (step 146), in step 148 the whole of the circuit is decided and the design is completed. On the other hand, when there is any problem, the operation returns properly to a necessary stage for redesign (step 150).

In the present embodiment, for the SS adapter 46 a reconfigurable one is employed until the wirings among the electronic circuit parts is decided in the first half of the design, and after the wirings is decided in the latter half of the design, the SS adapter 46 is replaced by one that is connectable among the adapter pins directly through metal. Therefore, the wirings can be altered with ease until they are decided. Meanwhile, after they are decided, an operation test is assured at a high speed without any influence thereon such as the transmission delay through a transfer gate. Herein, the SS adapter 46 according to the present invention is also easy to be replaced, so that the one that is connectable among the adapter pins directly through metal can be employed from the initial stage of the design and can be replaced by the SS adapter 46 when the wiring alteration is necessary or when the wiring alteration becomes necessary after the wirings are once decided.

Herein, although in the foregoing embodiment the present invention was applied to the one-board computer that mainly includes the CPU 30, large PLD 14B, and small PLD 14A, as illustrated in FIG. 1, application of the present invention is not limited to the one-board computer.

Figure 12:
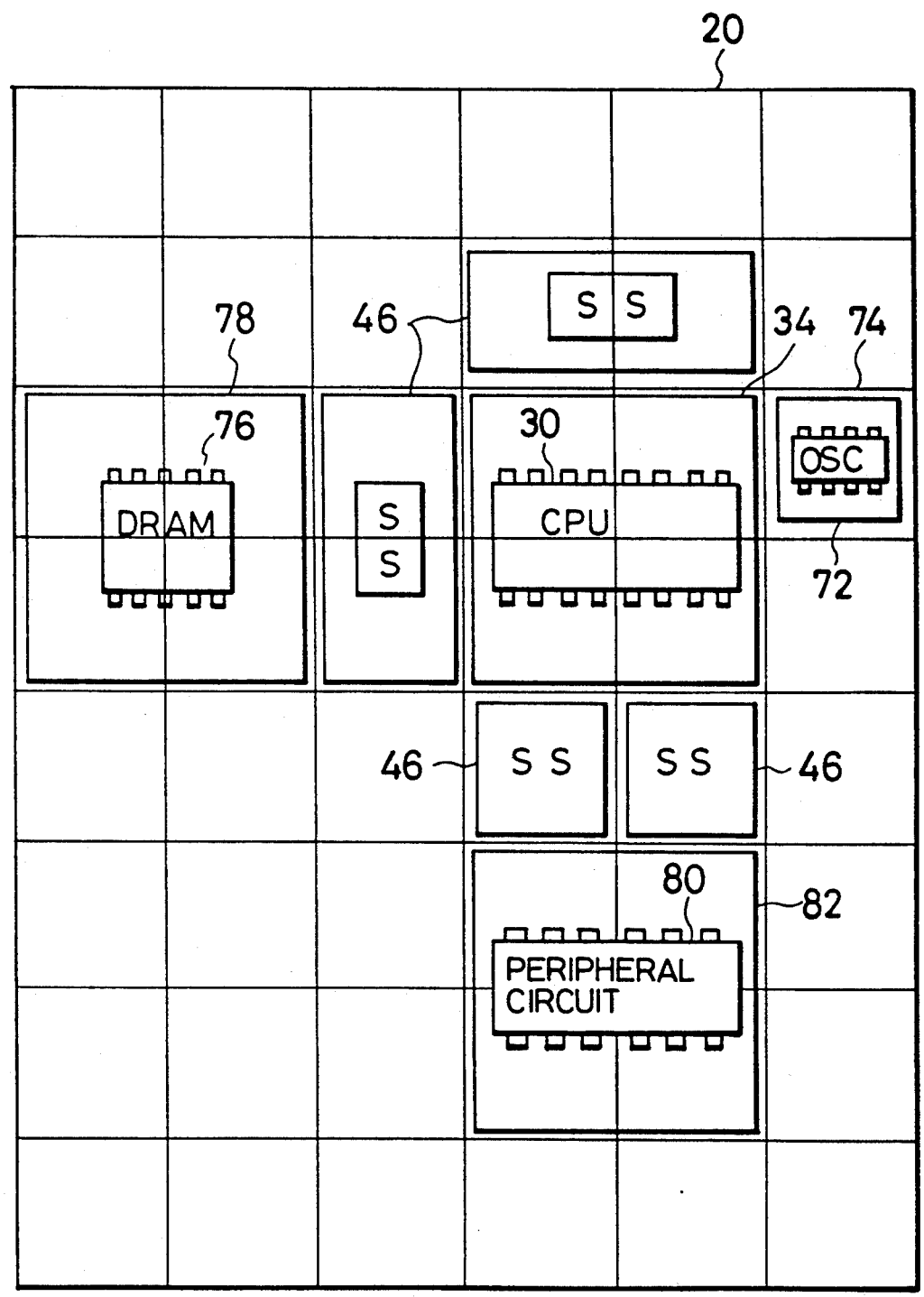
FIG. 12 is a plan view illustrating a second embodiment of the configurable electronic circuit board according to the present invention.

The present invention may be constructed in accordance with the size of the CPU 30 and the kinds of required peripheral circuits as disclosed in a second embodiment of the configurable electronic circuit board illustrated in FIG. 12, in which it comprises the pin adapter 34 for CPU having a size thereof four times of that of the modular socket, an oscillator (OSC) pin adapter 74 having a standard size for example, on which there is mounted a system clock oscillator (OSC) 72 for independently generating the system clock for the CPU 30, a pin adapter 78 for dynamic random access memory (DRAM) having a size thereof four times, for example, of that of the modular socket, on which a DRAM 76 has been mounted, a pin adapter 82 for peripheral circuit having a size four times, for example, of that of the modular socket, on which a peripheral circuit 80 has been mounted and SS adapters 46 each having, for example, a standard size and a size twice of that of the modular socket and being arranged between the CPU pin adapter 34, the DRAM pin adapter 78, the peripheral circuit pin adapter 82 and the like.

The configurable electronic circuit board of the second embodiment is preferable for the construction of a one-board computer and the development of full-custom chips such as a 64 bit microcomputer and of a Fuzzy logic chip, etc..

Figure 13:
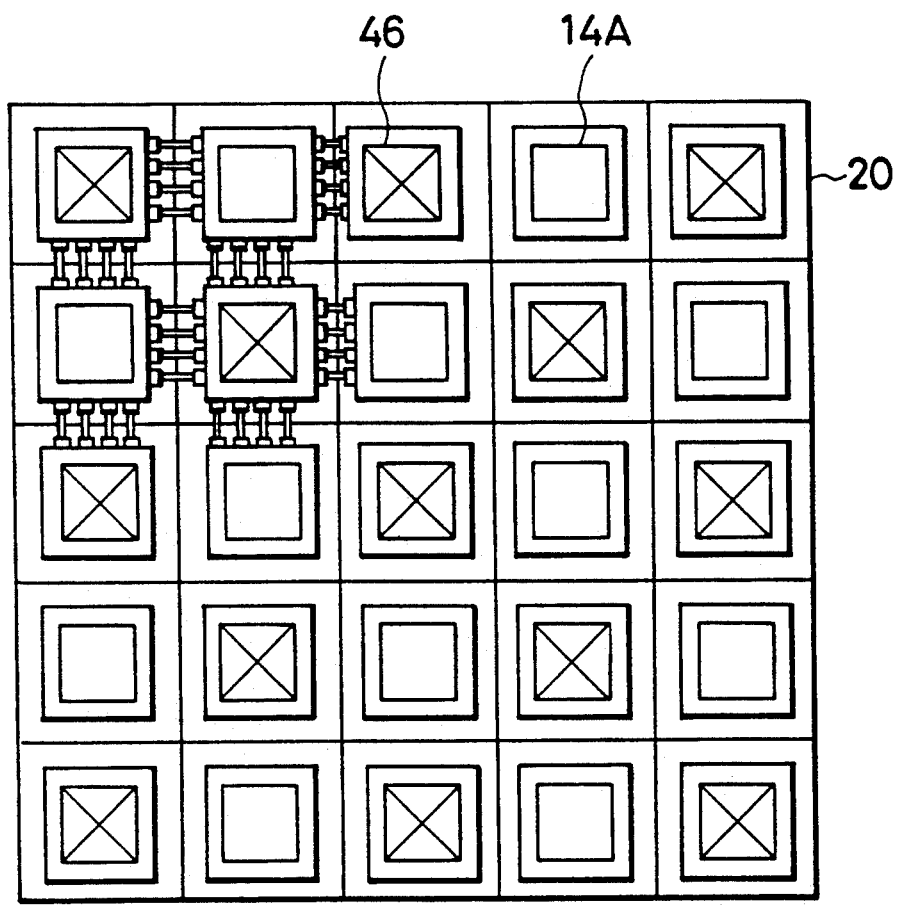
FIG. 13 is a plan view illustrating the construction of a third embodiment of the same.

Additionally, the present invention may be applicable to a PLD circuit system board, which does not include a CPU, as disclosed in a third embodiment of the configurable electronic circuit board illustrated in FIG. 13.

The third embodiment is to extend a PLD internal circuit to a board unit in which the SS adapters 46 and the small PLDs 14A are regularly arranged on the board 20 in a zig-zag manner as illustrated in FIG. 13.

Herein, the SS adapters 46 and the small PLDs 14A may instead be arranged randomly without limitation to the above case at need, and the embodiment may be constructed only with the small PLDs 14A and/or the large PLDs 14B without using the SS adapter 46.

The present embodiment, that does not include any CPU, is preferable for the construction of a macro-programmable circuit using a PLD array, and may also provide a one-board computer by constructing a CPU with the PLDs.

Herein, although in the above embodiments the small PLD 14A was assumed to be insertable directly into the modular socket 22, a pin adapter for the small PLD 14A may be available.

In the following, a fourth embodiment of the configurable electronic circuit board according to the present invention will be described with reference to FIG. 14.

Figure 15:
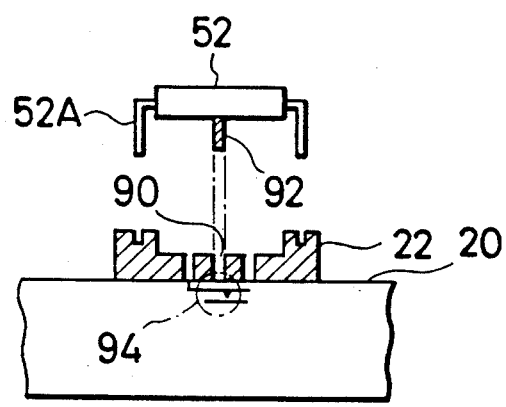
FIG. 15 is a sectional view illustrating a bypass adapter in the fourth embodiment and a method of mounting the same onto the board.

The fourth embodiment includes, in a configurable electronic circuit board identical to that in the first embodiment, five, for example, switch holes 90 formed through the central portion, for example, of each modular socket 22, and rod-shaped dogs 92 formed on the bottom of said adapter, the bypass adapter 52 for example, for insertion into the switch holes 90 as illustrated in FIG. 15, wherein an output from a switch contact 94, that is switched on and off by the dog 92 when the foregoing adapter is inserted into the modular socket 22, is inputted into a development tool 96 through the I/O port 21 of the board 20, whereby the kind and position of the adapter inserted into the modular socket 22 is made distinguishable.

Figure 16:
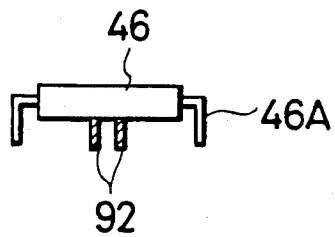
FIG. 16 is a side view illustrating the configuration of an SS adapter in the fourth embodiment.
Figure 17:
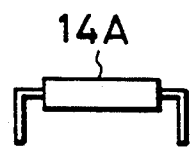
FIG. 17 is a side view illustrating the configuration of a small PLD in the fourth embodiment.

For the dogs 92, in case of the bypass adapter 52 for example, one dog may be provided at the center thereof as illustrated in FIG. 15, and in case of the SS adapter 46 two dogs for example may be provided for distinguishment of the adapter as illustrated in FIG. 16. Additionally, no dog 92 is provided on the small PLD 14A as illustrated in FIG. 17 to permit any parts not including such a dog 92 to be judged as a small PLD 14A. Because the small PLD 14A, that is directly inserted into the modular socket 22, is shipped intactly as a product. In case where the small PLD 14A is also inserted into the board 20 through a standard size pin adapter, the small PLD 14A can also be detected by providing a dog 92 on the pin adapter.

Figure 18:
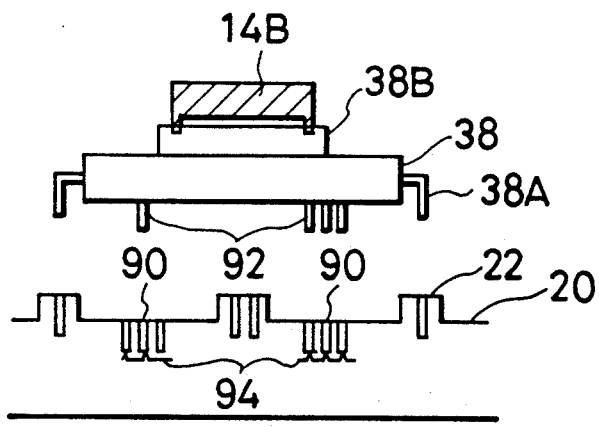
FIG. 18 is a sectional view illustrating a large PLD pin adapter in the fourth embodiment and a method of mounting the same on the board.
Figure 19:
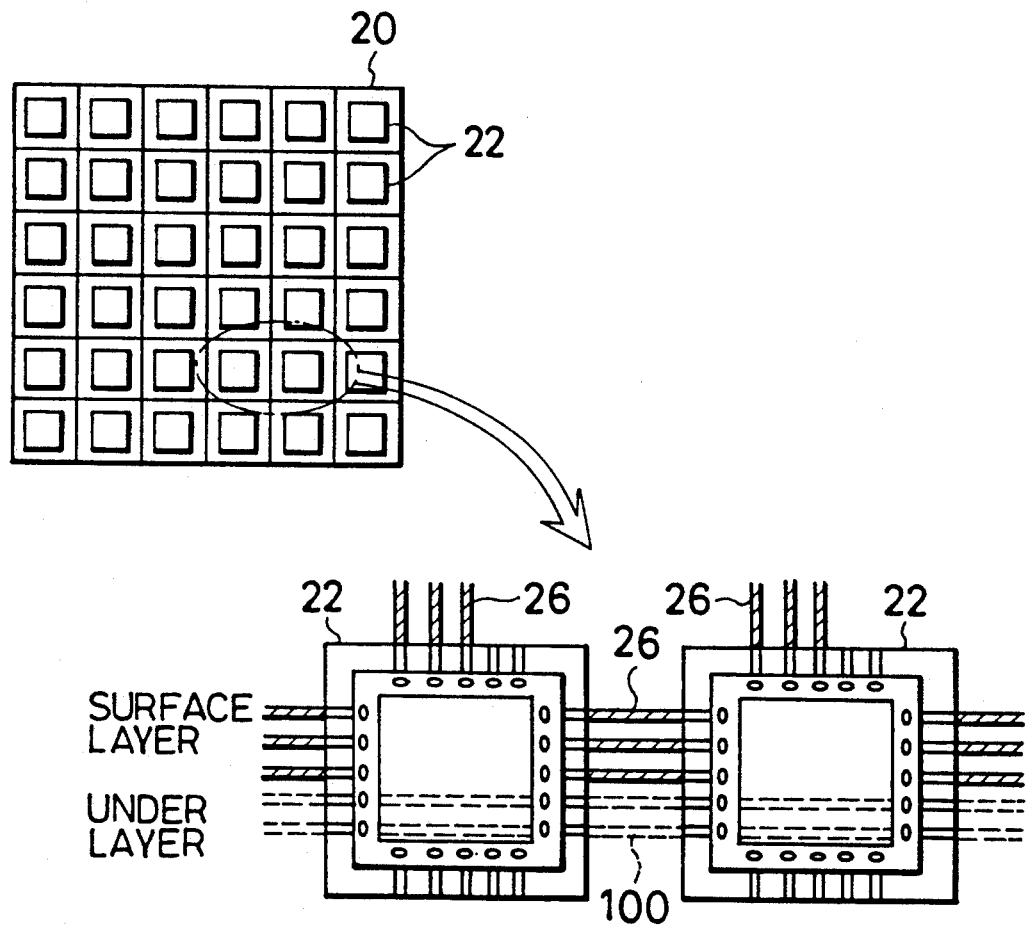
FIG. 19 is a plan view illustrating the construction of a portion of a board used in a fifth embodiment of the configurable electronic circuit board according to the present invention.
Figure 20:
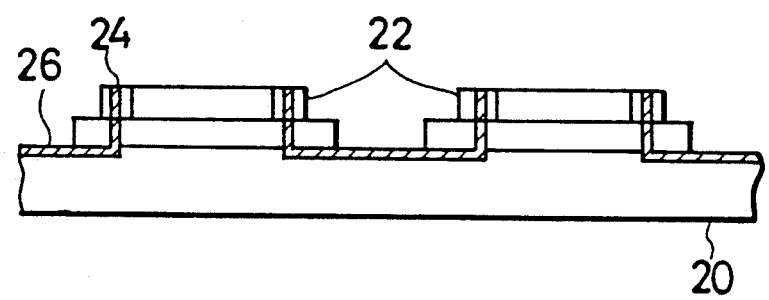
FIG. 20 is a sectional view illustrating the situation of a surface layer wiring in the fifth embodiment.
Figure 21:
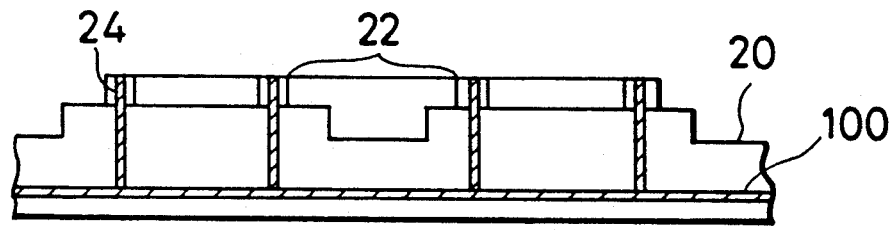
FIG. 21 is a sectional view illustrating the situation of an under layer wiring in the fifth embodiment.
Figure 22:
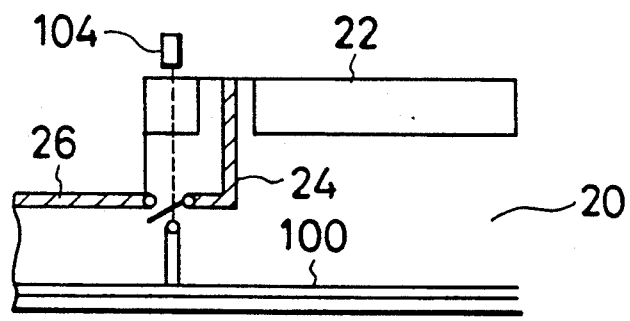
FIG. 22 is a sectional view illustrating the construction of a wiring changeover switch in the fifth embodiment.

Further, for the foregoing large PLD pin adapter 38, the pin adapter 38 can incorporate dogs 92 at a plurality of positions thereon as illustrated in FIG. 18. In case of the pin adapter 38 having a size four times of that of the modular socket, for example, it can incorporate such dogs 92 at four positions thereon, assuring distinguishment of the direction of mounting of the large PLD.

The PLD construction can therefore be inputted into the development tool 96 securely and rapidly by informing the PLD construction on the board 20 as above to a software for the configuration of the development tool 96.

Herein, although in the just-mentioned embodiment the rod-shaped dog 92 was provided on the bottom of each adaptor, it is also possible to distinguish the presence of the mounted parts by making use of any pin of the pin adapter and the like not used without providing such a dog 92.

Additionally, although in the just-mentioned embodiment the construction for distinguishing mounted parts was combined with the first embodiment, the construction may be applicable, without the combination with the board in the first embodiment, to a general electronic circuit board into which a plurality of kinds of adapters and electronic circuit parts are selectively insertable.

In succession, a fifth embodiment of the configurable electronic circuit board according to the present invention will be described with reference to FIGS. 19 to 22.

The fifth embodiment includes on a board 20 identical to that in the first embodiment, in addition to surface layer wiring 26 (refer to FIG. 20) for connecting between terminals 24 of adjacent modular sockets 22, under layer wiring 100 (refer to FIG. 21) for directly connecting between terminals of separated modular sockets 22 through a bus line (long line), and a wiring changeover switch 104 (refer to FIG. 22) for selectively connecting between the terminals 24 of modular socket and either the surface layer wiring 26 or the under layer wiring 100.

Figure 23:
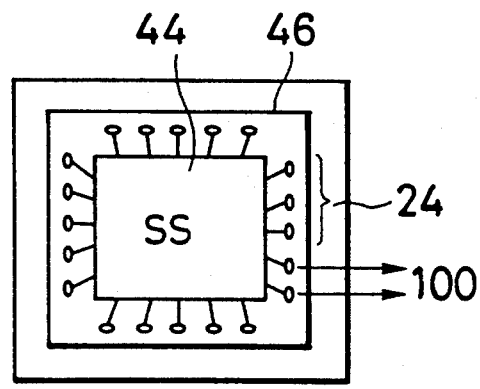
FIG. 23 is a plan view illustrating an SS adapter in the fifth embodiment.

In the fifth embodiment, an SS adapter 46 connects as illustrated in FIG. 23, arbitrary wiring 26 on a board surface layer to vertical/horizontal bus lines 100 extending thereunder.

In the fifth embodiment, a long line such as a bus line can be constructed by the under layer wiring 100, facilitating the wiring.

Switching information from the wiring changeover switch 104 can be inputted into the development tool 96 through any switching position distinguishing means like the fourth embodiment.

In the following, a sixth embodiment of the configurable electronic circuit board according to the present invention will be described.

Figure 24:
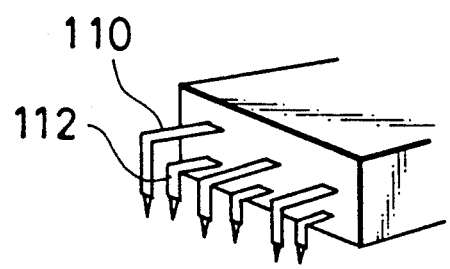
FIG. 24 is a perspective view illustrating the construction of a portion of an adapter used in a sixth embodiment of the configurable electronic circuit board according to the present invention.
Figure 25:
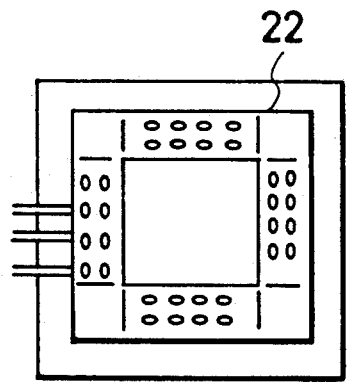
FIG. 25 is a plan view illustrating the construction of a modular socket in the sixth embodiment.
Figure 26:
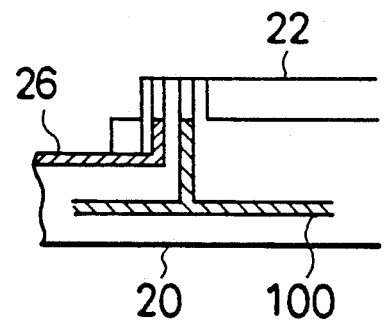
FIG. 26 is a sectional view illustrating the same.
Figure 27:
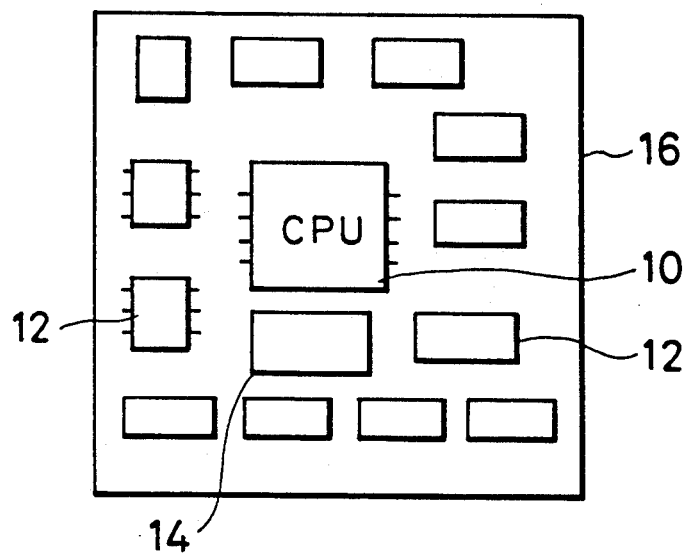
FIG. 27 is a plan view exemplarily illustrating the construction of a prior one-board computer.
Figure 28:
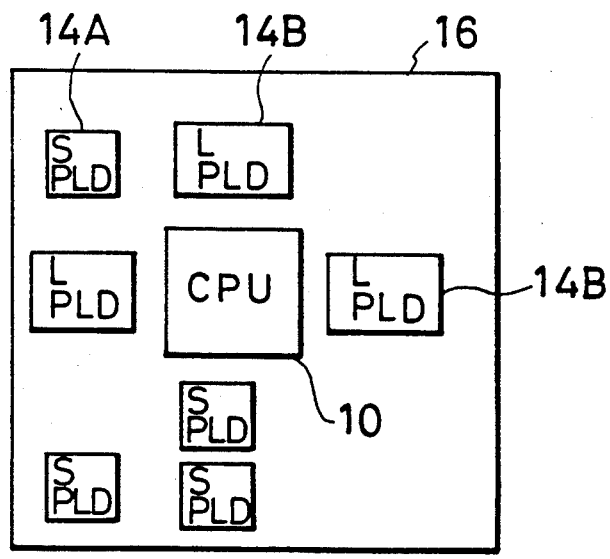
FIG. 28 is a plan view exemplarily illustrating a prior one-board computer with use of a PLD.

The sixth embodiment includes, as illustrated in FIG. 24, for the purpose of saving the area of the board 20, surface layer exclusive pins 110 and under layer (bus) exclusive pins 112, both provided independently on each adapter, and further including as illustrated in FIG. 25 holes provided correspondingly in the modular socket 22 for accepting independently the surface layer exclusive pins 110 and the under layer exclusive pins 112, whereby the surface layer exclusive pins 110 and the under layer exclusive pins 112 are independently connectable with the surface layer wiring 26 and the under layer wiring 100, respectively.

In the sixth embodiment, selection states of the surface layer wiring and the under layer wiring are also configured in the SS adapter 46 of the present invention similar to that in the first embodiment.

In the present embodiment, such an independent wiring changeover switch 104 as in the fifth embodiment is unnecessary, and the wiring conditions of the surface layer wiring 26 and the lower layer wiring 100 can be easily inputted into the development tool 96 according to the connection information of the SS adapter 46.

Herein, although in the fifth and sixth embodiments the construction using the double layer wiring was combined with the first embodiment, the construction is not limited thereto and is also applicable to a configurable electronic circuit board not including the bypass adapter for example.

What is claimed is:

1. A configurable electronic circuit board comprising:
   (a) a board including a plurality of modular sockets in a minimum unit, each of said modular sockets having a standardized size and a standardized number of pins, said modular sockets being arranged in parallel relationship with one another and connected at terminals thereof to one another through simple wirings;
   (b) a pin adapter having a size which is a positive integer multiple of that of said modular sockets and composed of adapter pins insertable into said modular sockets, of an adapter socket into which electronic circuit parts are insertable, and of socket wiring for connecting said adapter socket with said adapter pins;
   (c) a switching station adapter having a size which is a positive integer multiple of that of said modular sockets and composed of adapter pins insertable into said modular sockets, and of wiring determining means for determining the connection of wiring among said adapter pins; and
   (d) a bypass adapter having a size which is a positive integer multiple of that of said modular sockets and being inserted into one of said modular sockets which is not used, composed of adapter pins insertable into said modular sockets, and of fixed wiring for simply bypass connecting among said adapter pins,
   whereby an arbitrary circuit is realizable by inserting each said adapter and said electronic circuit parts into an arbitrary modular socket.

2. A configurable electronic circuit board according to claim 1 wherein said modular sockets each have a size and the number of pins corresponding to electronic circuit parts of a standard size and the standard number of pins are directly insertable into each said modular socket without use of said pin adapter.

3. A configurable electronic circuit board according to claim 1 wherein said board includes surface layer wiring for connecting terminals of adjacent modular sockets, under layer wiring for directly connecting terminals of separated modular sockets, and a wiring changeover switch for connecting between terminals of the modular socket and one of said surface layer wiring and said under layer wiring.

4. A configurable electronic circuit board according to claim 3 wherein said surface layer wiring and said under layer wiring are both connected to the terminals of the modular sockets, and said switching station adapter includes therein said wiring changeover switch.

5. A configurable electronic circuit board comprising a plurality of modular sockets in a minimum unit, each of said sockets having a standardized size and a standardized number of pins, said modular sockets being arranged in parallel relationship to one another and being connected at terminals thereof to each other through simple wirings, said configurable electronic circuit board further comprising:
   (a) surface layer wiring for connecting terminals of adjacent modular sockets;
   (b) under layer wiring for directly connecting terminals of separated modular sockets; and
   (c) a wiring changeover switch for connecting between terminals of the modular socket and one of said surface layer wiring and said under layer wiring, said wiring changeover switch enabling the determination of the board wiring.

6. A configurable electronic circuit board comprising at least one socket into which at least one of a plurality of kinds of electronic circuit parts and adapters are selectively insertable, the board further comprising;
   detector means provided on said socket, for detecting the kind of said at least one of said electronic circuit parts and said adapter inserted into said socket, whereby the kind and position of said inserted electronic circuit parts and of said inserted adapter are distinguishable simultaneously with the insertion of one of the electronic circuit part and the adapter.

7. A configurable electronic circuit board according to claim 6 wherein said detector means includes a switch for detecting the kind of at least one of said adapter and said electronic circuit parts by using a dog provided on the bottom of one of the adapter and the electronic circuit parts.

8. An adapter for insertion into a modular socket of a configurable electronic circuit board, said board including a plurality of modular sockets in a minimum unit, each of said sockets having a standardized size thereof and a standardized number of pins, said modular sockets being arranged in parallel relationship to one another at terminals thereof through simple wirings, said adapter having a size thereof which is a positive integer multiple of that of said modular sockets and comprising:
   (a) adapter pins insertable into said modular sockets; and
   (b) wiring determining means for determining the connection of wirings among said adapter pins.

9. An adapter for a configurable electronic circuit board according to claim 8 wherein said wiring determining means is connectable among said adapter pins through metal.

10. An adapter for a configurable electronic circuit board according to claim 8 wherein there is provided distinguishing means for distinguishing at least one of said adapter and electronic circuit parts mounted on said adapter.

11. An adapter for insertion into a modular socket of a configurable electronic circuit board, said board including a plurality of modular sockets in a minimum unit, each of said modular sockets having standardized size and a standardized number of pins, said modular sockets being arranged in parallel relationship with one another and being connected to one another at terminals thereof through wirings, said adapter having a size which is a positive integer multiple of that of said modular socket, said adapter comprising adapter pins insertable into said modular socket and wiring determining means for determining the connection of said wirings among said adapter pins, said wiring determining means including a wiring changeover switch for connecting between the terminals of said modular socket and one of the surface layer wiring and the under layer wiring of the electronic circuit board.

* * * * *